(12) United States Patent
Zeng

(10) Patent No.: US 10,007,157 B2
(45) Date of Patent: Jun. 26, 2018

(54) COLOR-FILTER-ON-ARRAY SUBSTRATE AND METHOD OF MANUFACTURING THEREOF

(71) Applicant: SHENZHEN CHINA STAR OPTOELECTRONICS TECHNOLOGY CO., LTD., Guangdong (CN)

(72) Inventor: Mian Zeng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 229 days.

(21) Appl. No.: 14/915,237

(22) PCT Filed: Jan. 28, 2016

(86) PCT No.: PCT/CN2016/072444
§ 371 (c)(1),
(2) Date: Feb. 28, 2016

(87) PCT Pub. No.: WO2017/113467
PCT Pub. Date: Jul. 6, 2017

(65) Prior Publication Data
US 2018/0052373 A1 Feb. 22, 2018

(30) Foreign Application Priority Data
Dec. 31, 2015 (CN) .......................... 2015 1 1030775

(51) Int. Cl.
*H01L 27/12* (2006.01)
*G02F 1/1362* (2006.01)
(Continued)

(52) U.S. Cl.
CPC ...... *G02F 1/136227* (2013.01); *G02F 1/1368* (2013.01); *G02F 1/13439* (2013.01);
(Continued)

(58) Field of Classification Search
CPC ........... G02F 1/136227; G02F 1/13439; G02F 1/1368; H01L 27/124; H01L 27/1248;
(Continued)

(56) References Cited

U.S. PATENT DOCUMENTS

2005/0082534 A1* 4/2005 Kim .................. H01L 27/3248
257/72
2009/0190054 A1* 7/2009 Kim .................. G02F 1/13394
349/42
(Continued)

FOREIGN PATENT DOCUMENTS

CN 1542520 A 11/2004
CN 102074505 A 5/2011
(Continued)

*Primary Examiner* — Michael Trinh
(74) *Attorney, Agent, or Firm* — Andrew C. Cheng

(57) ABSTRACT

This disclosure provides a COA substrate includes a substrate, and a gate, a gate dielectric layer, an active layer, a source, a drain, a first passivation layer, a color blocking layer, a second passivation layer, and a transparent conductive layer are formed on the substrate in order subsequently. A first hole is formed in the color blocking layer to expose the first passivation layer. The second passivation layer is disposed on the color blocking layer and in the first hole. A second hole is formed in the first hole to punch through the first passivation layer and the second passivation layer for exposing the drain and the source. A conductive fill-in material layer is formed in the first hole and the second hole. The aperture rate is increased and the bubble failure is improved and the pixel electrode disconnection due to the height gap is reduced in the present disclosure.

5 Claims, 2 Drawing Sheets

(51) Int. Cl.
*G02F 1/1368* (2006.01)
*G02F 1/1343* (2006.01)

(52) U.S. Cl.
CPC ........ H01L 27/124 (2013.01); H01L 27/1248 (2013.01); H01L 27/1262 (2013.01); H01L 27/1288 (2013.01); H01L 27/1292 (2013.01); *G02F 2001/136222* (2013.01); *G02F 2201/123* (2013.01)

(58) Field of Classification Search
CPC ............. H01L 27/1262; H01L 27/1288; H01L 27/1292
See application file for complete search history.

(56) References Cited

U.S. PATENT DOCUMENTS

| | | | | |
|---|---|---|---|---|
| 2012/0068173 | A1* | 3/2012 | Umezaki | G09G 3/342 257/43 |
| 2015/0055075 | A1* | 2/2015 | Naoe | G02F 1/133345 349/138 |
| 2016/0170253 | A1* | 6/2016 | Song | G02F 1/1368 257/72 |
| 2016/0259191 | A1* | 9/2016 | Sun | G02F 1/136 |
| 2016/0349556 | A1* | 12/2016 | Kanzaki | H01L 21/0217 |

FOREIGN PATENT DOCUMENTS

| | | |
|---|---|---|
| CN | 104157612 A | 11/2014 |
| CN | 104503127 A | 4/2015 |
| CN | 104656325 A | 5/2015 |

\* cited by examiner

COLOR-FILTER-ON-ARRAY SUBSTRATE AND METHOD OF MANUFACTURING THEREOF

CROSS REFERENCE

This application claims the priority of Chinese Patent Application No. 201511030775.4, entitled "Color-filter-on-array substrate and method of manufacturing thereof", filed on Dec. 31, 2015, the disclosure of which is incorporated herein by reference in its entirety.

FIELD OF THE INVENTION

This disclosure is related to LCD technology, especially related to a color filter on Array (COA) substrate and a method to make of.

BACKGROUND OF THE INVENTION

The compact size, low power consumption and no radiation are the major advantages of TFT-LCD. Those advantages make TFT-LCD a dominated technology in the panel display industry and widely adapted in every aspect. The conventional display panel comprises a color filter and an array substrate, wherein R, G, and B color blocks are disposed on the color filter. The color filter on array (COA) substrate is an array substrate with a color filter formed thereon to reduce the light leakage due to the misalignment, lower the capacity coupling between the signal line and the pixel electrode. The aperture rate is increased as well. Therefore, this technology is widely applied on the LCD industry.

However, in the conventional COA substrate, the color filter is thicker, generally with a thickness of several minimeter. The large contact hole between the signal line and the pixel electrode is required to make sure the electrically contact. Some bubbles would appear because gas would be trapped in the contact hole due to the high aspect ratio of the contact hole during the manufacture process. Moreover, the light leakage is occurred due to the liquid crystal misalignment around the contact hole. The aperture rate is reduced as well. Meanwhile, the electric disconnection occurs because of large slope of the sidewall of the contact hole. This makes the pixel electrode fail to recharge and influence the quality of the liquid crystal display panel.

Therefore, this disclosure discloses a new COA substrate and a manufacturing method to make of to solve the above issues.

SUMMARY OF THE INVENTION

This disclosure discloses a COA substrate and a manufacturing method to make of to solve the large contact hole, bubble failures due to the high aspect rate of the contact hole, low aperture rate and the electrical disconnection of the pixel electrode due to the level gap.

To solve those problems, this disclosure provides a COA substrate comprises a substrate, a gate disposed on the substrate; a gate dielectric layer disposed between the substrate and the gate, and covering the substrate and the gate; an active layer disposed on the gate dielectric layer for forming a channel; a source and a drain disposed on the gate dielectric layer and contacting with two ends of the active layer; a first passivation layer covering the source, the drain, the gate dielectric layer and the active layer; a color blocking layer covering the first passivation layer; a first hole disposed in the color blocking layer to expose the first passivation layer; a second passivation layer disposed on the color blocking layer and the first hole a second hole disposed in the first hole to punch through the first passivation layer and the second passivation layer for exposing the source and the drain; a conductive material filled in the first hole and the second hole; and a transparent conductive layer disposed on the second passivation layer and the conductive material, wherein the conductive material comprises organic conductive materials.

In one embodiment of the present disclosure, the organic conductive material comprises at least one of the group consisting of p-polyphenyl (PPP), Polypyrrole (PPy), polythiophene (PTh), poly (p-phenylene vinylene) (PPV), and polyaniline (PANi).

In another embodiment of the present disclosure, the conductive layer is formed by the ink printing technology.

In the other embodiment of the present disclosure, the conductive layer is formed by printing organic conductive materials, covering a photo resist and lithographing.

In the other embodiment of the present disclosure, the surface of the conductive layer and the surface of the second passivation layer are at the same level.

This disclosure also discloses a method to manufacturing a COA substrate comprises: forming a gate on a substrate; forming a gate dielectric on the gate and the surface of the substrate not being covered by the gate; forming an active layer on the gate dielectric layer being right on top of the gate; forming a source and a drain on the gate dielectric layer wherein the source and the drain contacts the ends of the active layer respectively; forming a first passivation layer on the source, the drain, the gate dielectric layer, and the active layer; forming a color blocking layer on the first passivation layer; forming a first hole in the color blocking layer to expose the first passivation layer; forming a second passivation layer in the first hole and covering on the color blocking layer, wherein a second hole is formed to punch through the first passivation and the second passivation for exposing the drain and the source; forming a conductive fill-in material layer with conductive materials in the first hole and the second hole, wherein the conductive material comprises organic conductive materials; forming a transparent conductive layer on the second passivation layer and the conductive fill-in material layer; and patterning the transparent conductive layer to form a pixel electrode.

In one embodiment of the present disclosure, the organic conductive material comprises at least one of the group consisting of p-polyphenyl (PPP), Polypyrrole (PPy), polythiophene (PTh), poly (p-phenylene vinylene) (PPV), and polyaniline (PANi).

In another embodiment of the present disclosure, the conductive fill-in material layer with conductive materials is formed in the first hole and the second hole by printing technology.

In the other embodiment of the present disclosure, the step of forming a conductive fill-in material layer with conductive materials in the first hole and the second hole further comprises covering the organic conductive materials in the first hole and the second hole, covering a photo resist layer, and performing a lithography technology.

In the other embodiment of the present disclosure, the surface of the conductive layer and the surface of the second passivation layer are at the same level.

In the present disclosure, the level gap is reduced, the liquid crystals misalignment is prevented, and the aperture rate is increased by filling in the conductive material in the contact hole. Moreover, gas remained in the contact hole is reduced, and the bubble failure rate in the upcoming manufacturing process is lowered as well. Meanwhile, the disconnection of the pixel electrode due to the level gap is avoided to improve the quality of the display panel.

BRIEF DESCRIPTION OF THE DRAWINGS

The disclosure is best understood from the following detailed description when read in connection with the accompanying drawings, which illustrate an embodiment of the present disclosure.

DETAILED DESCRIPTION OF PREFERRED EMBODIMENTS

The present disclosure will now be described more specifically with reference to the following embodiments. It is to be noted that the following descriptions of embodiments are presented herein for purpose of illustration and description only. It is not intended to be exhaustive or to be limited to the precise form disclosed.

Figure 1:
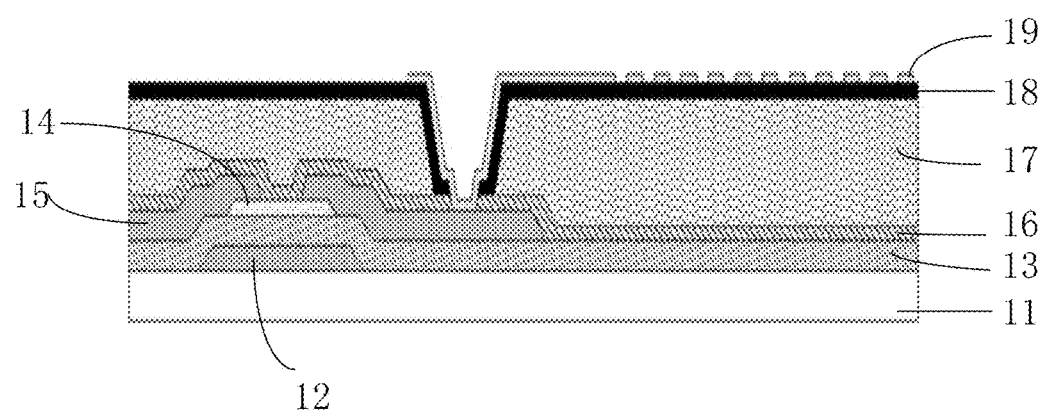
FIG. 1 is the diagram of the conventional COA substrate.

FIG. 1 illustrates a conventional structure of the color filter on array (COA) substrate. The conventional COA substrate comprises a substrate 11, a gate 12, a gate dielectric layer 13, an active layer 14, a drain and a source 15, a first passivation layer 16, a color blocking layer 16, a second passivation layer 18, and a transparent conductive layer 19.

Figure 2:
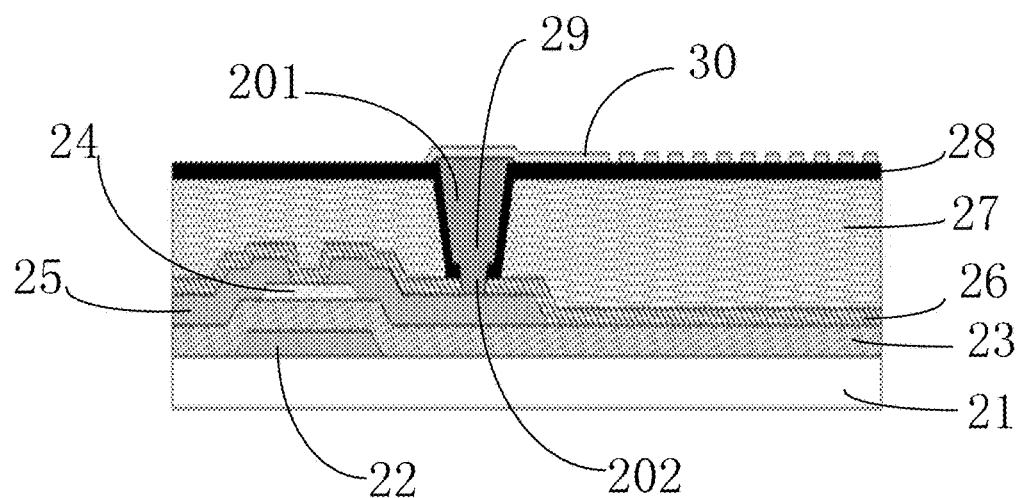
FIG. 2 is the diagram of the COA substrate in the present disclosure

FIG. 2 illustrates the COA substrate structure of the present disclosure. In FIG. 2, the COA substrate in the present embodiment comprises a substrate 21, a gate 22, a gate dielectric layer 23, an active layer 24, a source and a drain 25, a first passivation layer 26, a color blocking layer 27, a second passivation layer 28, a conductive fill-in layer 29, and a transparent conductive layer 30.

In the present embodiment, the gate 22 is disposed on the substrate 2.

The gate dielectric layer 23 is disposed on the gate 22 and the substrate 21 to cover the gate 22 and the substrate 21.

The active layer 23 is disposed on the gate dielectric layer 23. To be precise, the active layer is located on the gate dielectric layer at the location which is right on top of the gate 22 to form a channel.

The source and drain 25 are disposed on the gate dielectric layer and the source and drain 25 are respective contacted with two ends of the active layer 24.

The first passivation layer 26 is formed on the source and the drain 25, the gate dielectric layer 23 and the active layer 24 to cover them accordingly.

The color blocking layer 27 is disposed first passivation layer 26. A first hole 30 is formed in the color blocking layer 27, and the color blocking layer 27 is punched through by the first hole 201 expose the first passivation layer 26.

The second passivation layer 28 is disposed on the color blocking layer 27 and in the first hole 201. A second hole 202 is formed in the second passivation layer 28 and in the first hole 201. The second passivation layer 28 and the first passivation 26 are punch through by the second hole 202 to expose the source and the drain 25.

The first hole 201 and the second hole 202 is filled with the conductive fill-in layer 29. The conductive material of the conductive fill-in layer can be the organic conductive material.

The transparent conductive layer 30 is disposed on the second passivation layer and the conductive fill-in layer 29.

In one embodiment of the present disclosure, the organic conductive material can be at least one of the group consisting of p-polyphenyl (PPP), Polypyrrole (PPy), polythiophene (PTh), poly (p-phenylene vinylene) (PPV), and polyaniline (PANi).

In another embodiment of the present disclosure, the conductive fill-in layer 29 is formed by ink printing technology.

In the other embodiment of the present disclosure, the conductive fill-in layer 29 is formed by forming a photo resist layer on the conductive material, lithographing the photo resist layer by the exposure and development technology to a predetermined pattern, etching the conductive material according to the photo resist with the predetermined pattern, and striping the photo resist layer.

In the other embodiment of the present disclosure, the first hole 201 and the second hole 202 are filled with the conductive fill-in layer which is electrically contacted with the source and the drain 25.

In a preferred embodiment, the top surface of the conductive fill-in layer 29 and the top surface of the second passivation layer 28 are at the same level.

In another embodiment, the materials of the substrate 21, the gate 22, the gate dielectric layer 23, the active layer 24, the source and the drain 25, the first passivation layer 26, the color blocking layer 27, and the second passivation layer 28, and the transparent conductive layer 30 may be the conventional materials in this industry. There is no specific limitation on the selection of those materials in the present disclosure.

To compare with the conventional structure of the COA substrate, the COA substrate of the present disclosure comprise the conductive fill-in layer in the contact hole by filling with conductive materials. The level gap is reduced, the liquid crystal misalignment is prevented, and the aperture rate is increased in the embodiments of the present disclosure. Moreover, gas remained in the contact hole is reduced, and the bubble failure rate in the upcoming manufacturing process is lowered as well. Meanwhile, the disconnection of the pixel electrode due to the level gap is avoided to improve the quality of the display panel. The embodiments of the present disclosure could be applied in all COA-type LCD panels.

Figure 3:
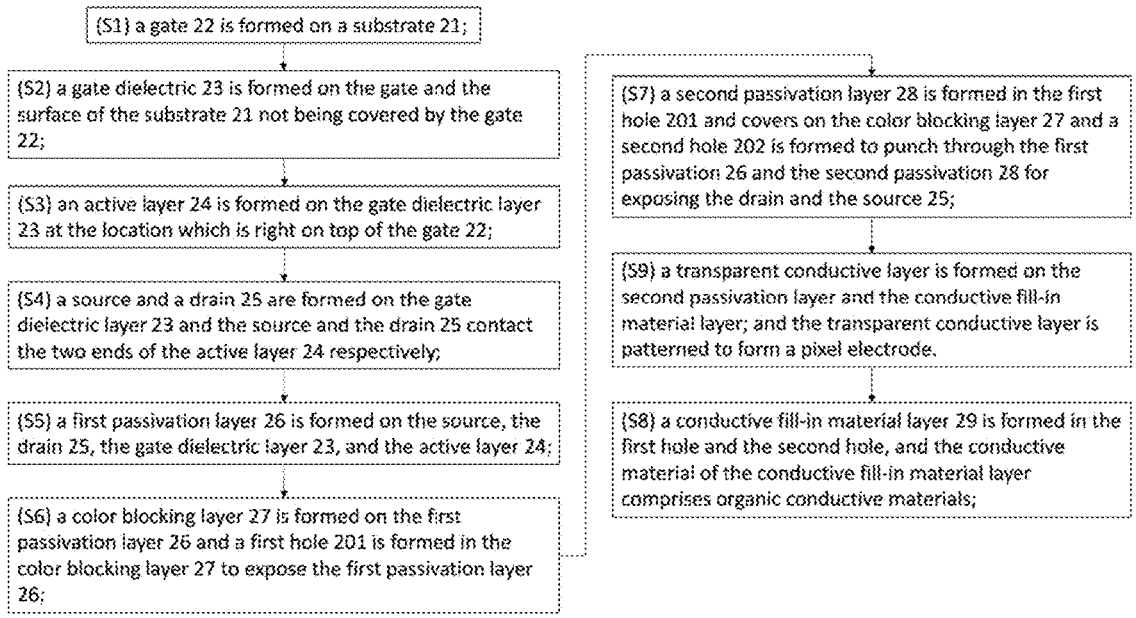
FIG. 3 is the diagram of the manufacturing steps of the COA substrate in the present disclosure.

FIG. 3 illustrates the manufacturing steps of the COA substrate in the present disclosure. The method of manufacturing the COA substrate comprises the following steps:

(S1) a gate 22 is formed on a substrate 21;
(S2) a gate dielectric 23 is formed on the gate and the surface of the substrate 21 not being covered by the gate 22;
(S3) an active layer 24 is formed on the gate dielectric layer 23 at the location which is right on top of the gate 22;
(S4) a source and a drain 25 are formed on the gate dielectric layer 23 and the source and the drain 25 contact the two ends of the active layer 24 respectively;
(S5) a first passivation layer 26 is formed on the source, the drain 25, the gate dielectric layer 23, and the active layer 24;
(S6) a color blocking layer 27 is formed on the first passivation layer 26 and a first hole 201 is formed in the color blocking layer 27 to expose the first passivation layer 26;
(S7) a second passivation layer 28 is formed in the first hole 201 and covers on the color blocking layer 27 and a second hole 202 is formed to punch through the first passivation 26 and the second passivation 28 for exposing the drain and the source 25;

(S8) a conductive fill-in material layer 29 is formed in the first hole and the second hole, and the conductive material of the conductive fill-in material layer comprises organic conductive materials;

(S9) a transparent conductive layer is formed on the second passivation layer and the conductive fill-in material layer; and the transparent conductive layer is patterned to form a pixel electrode.

In one embodiment of the present disclosure, the organic conductive material can be at least one of the group consisting of p-polyphenyl (PPP), Polypyrrole (PPy), polythiophene (PTh), poly (p-phenylene vinylene) (PPV), and polyaniline (PANi).

In another embodiment of the present disclosure, the conductive fill-in layer 29 is formed by ink printing technology.

In the other embodiment of the present disclosure, the conductive fill-in layer 29 is formed by forming a photo resist layer on the conductive material, lithographing the photo resist layer by the exposure and development technology to a predetermined pattern, etching the conductive material according to the photo resist with the predetermined pattern, and striping the photo resist layer.

In the other embodiment of the present disclosure, the step S8 further comprises a planarization process after the conductive fill-in layer 29 is formed to make the top surface of the conductive fill-in layer 29 and the top surface of the second passivation layer 28 are at the same level. To be specific, the conductive material outside the first hole 201 is removed by exposing, developing and etching technology. The conductive material only remains in the contact hole (i.e., the first hole 201 and the second hole 202) and the top surface of the conductive fill-in layer 29 and the top surface of the second passivation layer 28 are at the same level.

To be specific, the substrate 21, the gate 22, the gate dielectric layer 23, the active layer 24, the source and the drain 25, and the first passivation layer 26 can be formed by conventional processes, such as PVD, CVD, exposing, developing, and etching. Subsequently, an RGB color blockers are applied on the first passivation layer 26 to form the color blocking layer 27 and the first hole 201 is formed by the lithography and etching technology. The second passivation layer 28 is deposited in the first hole 201 and on the color blocking layer 27 and the second hole 202 is formed by the lithography and etching technology to expose the source and the drain 25. Subsequently, the conductive fill-in layer 29 is formed in the first hole 201 and the second hole 202 to make the first hole 201, the second hole 202 are filled up with the conductive material and the conductive fill-in layer 29 is electrically contacted with the source and the drain 25. At last, the transparent conductive layer 30 is formed on the conductive fill-in layer 29 and the second passivation layer, and the transparent conductive layer 30 is patterned by the lithography and etching technology to form a pixel electrode. The materials of the transparent conductive layer 30 may be ITO, IZO or thin metal.

Before the transparent conductive layer is formed by ITO sputter technology, one of the embodiment further comprises a planarization process after the conductive fill-in layer 29 is formed. After the conductive fill-in layer 29 is formed by the coating process, a planarization process is performed. Subsequently, the transparent conductive layer 30 is formed by ITO sputtering process and patterning process. The level gap is reduced, the liquid crystal misalignment is prevented, and the aperture rate is increased in the embodiments of the present disclosure. Moreover, gas remained in the contact hole is reduced, and the bubble failure rate in the upcoming manufacturing process is lowered as well. Meanwhile, the disconnection of the pixel electrode due to the level gap is avoided to improve the quality of the display panel.

Although the description above contains many specificities, these should not be construed as limiting the scope of the embodiment but as merely providing illustrations of some of the presently preferred embodiments. Rather, the scope of the disclosure is to be determined only by the appended claims and their equivalents.

What is claimed is:

1. A method to manufacturing a COA substrate, comprising:

forming a gate on a substrate;

forming a gate dielectric on the gate and the surface of the substrate not being covered by the gate;

forming an active layer on the gate dielectric layer being right on top of the gate;

forming a source and a drain on the gate dielectric layer wherein the source and the drain contacts the ends of the active layer respectively;

forming a first passivation layer on the source, the drain, the gate dielectric layer, and the active layer;

forming a color blocking layer on the first passivation layer;

forming a first hole in the color blocking layer to expose the first passivation layer;

forming a second passivation layer in the first hole and covering on the color blocking layer, wherein a second hole is formed to punch through the first passivation and the second passivation for exposing the drain and the source;

forming a conductive fill-in material layer with conductive materials in the first hole and the second hole, wherein the conductive material comprises organic conductive materials;

forming a transparent conductive layer on the second passivation layer and the conductive fill-in material layer; and patterning the transparent conductive layer to form a pixel electrode.

2. The method according to claim 1, wherein the organic conductive material comprises at least one of the group consisting of p-polyphenyl (PPP), Polypyrrole (PPy), polythiophene (PTh), poly (p-phenylene vinylene) (PPV), and polyaniline (PANi).

3. The method according to claim 1, wherein the conductive fill-in material layer with conductive materials is formed in the first hole and the second hole by printing technology.

4. The method according to claim 1, wherein the step of forming a conductive fill-in material layer with conductive materials in the first hole and the second hole further comprises covering the organic conductive materials in the first hole and the second hole, covering a photo resist layer, and performing a lithography technology.

5. The method according to claim 1, wherein the surface of the conductive layer and the surface of the second passivation layer are at the same level.

* * * * *